United States Patent [19]

Harringer et al.

[11] Patent Number: 4,681,208

[45] Date of Patent: Jul. 21, 1987

[54] METHOD AND APPARATUS FOR PRESENTING AN ARTICLE TO A WORK STATION

[75] Inventors: Robert V. Harringer, Joliet; Robert O. Rada, Brookfield; Edward J. Vesely, Woodridge, all of Ill.

[73] Assignee: American Telephone and Telegraph Company, AT&T Technologies, Inc., Berkeley Heights, N.J.

[21] Appl. No.: 762,654

[22] Filed: Aug. 5, 1985

[51] Int. Cl.⁴ ............................................. B65G 43/08
[52] U.S. Cl. ................................. 198/341; 198/437; 198/457; 198/463.2; 198/464.2; 198/465.1; 198/857; 29/759
[58] Field of Search ............ 198/340, 341, 343, 463.3, 198/464.2, 437, 464.3, 464.4, 465.1, 465.2, 465.3, 468.8, 469.1, 474.1, 483.1, 487.1, 456, 457, 459, 460, 462, 772–777, 955, 801, 802, 795, 857; 29/759

[56] References Cited

U.S. PATENT DOCUMENTS

| | | | |
|---|---|---|---|
| 3,625,336 | 12/1971 | Fuwa | 198/456 X |
| 3,718,197 | 2/1973 | Barten et al. | 198/814 X |
| 3,934,707 | 1/1976 | Bowman | 198/460 |
| 4,029,198 | 6/1977 | Lingl, Jr. | 198/460 X |
| 4,067,450 | 1/1978 | Birdwell | 198/774 X |
| 4,109,781 | 8/1978 | Moons | 198/468.8 X |
| 4,149,623 | 4/1979 | Nelson | 198/470.1 |
| 4,149,626 | 4/1979 | Holt | 198/460 X |
| 4,346,514 | 8/1982 | Makizawa et al. | 29/740 |
| 4,511,030 | 4/1985 | Lem | 198/633 |

FOREIGN PATENT DOCUMENTS

| | | | |
|---|---|---|---|
| 1239238 | 4/1967 | Fed. Rep. of Germany | 198/459 |
| 2505282 | 8/1976 | Fed. Rep. of Germany | 198/459 |
| 2376047 | 9/1978 | France | 198/774 |
| 0139237 | 10/1981 | Japan | 198/468.8 |
| 0093825 | 6/1982 | Japan | 198/459 |
| 0385717 | 3/1965 | Switzerland | 198/459 |

*Primary Examiner*—Robert J. Spar
*Assistant Examiner*—Lyle Kimms
*Attorney, Agent, or Firm*—Maurice de Picciotto; Ross T. Watland

[57] ABSTRACT

A technique for moving and presenting an article to a work station is described. A plurality of articles, loaded onto a conveyor system, are moved so that a leading article is positioned at a pick-up and elevating station (46). A separating mechanism (44) is activated to lift (via 90, 91) from the conveyor system (42) all of the articles which trail the leading article, and to move them a predetermined distance behind and away from the elevating station (46). Next, the leading article is elevated above the plane of the conveyor system in order to facilitate its removal therefrom (FIG. 3).

9 Claims, 8 Drawing Figures

FIG. 5
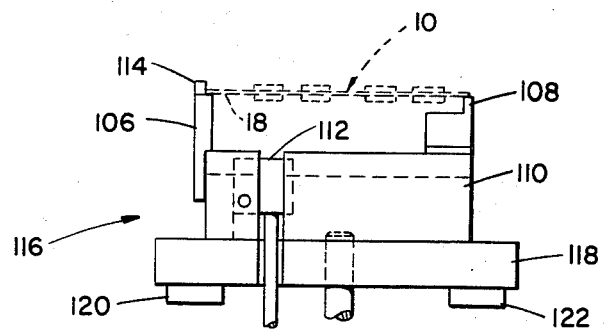
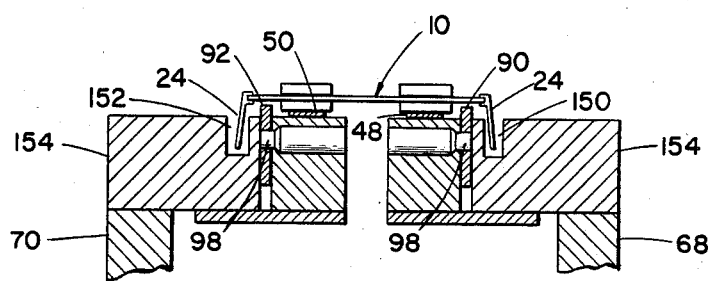
FIG. 7
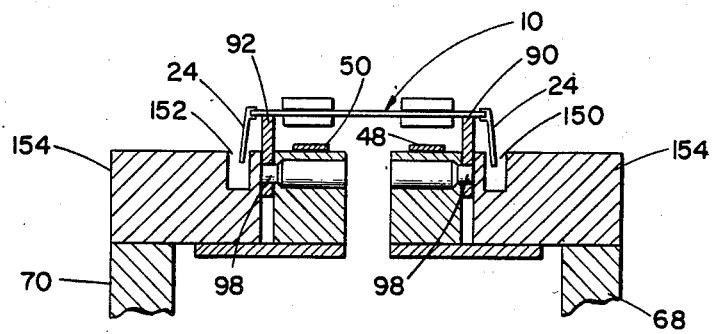
FIG. 8

METHOD AND APPARATUS FOR PRESENTING AN ARTICLE TO A WORK STATION

FIELD OF THE INVENTION

This invention relates to a method and an apparatus for presenting articles to a work station, and more particularly, to a method and an apparatus for separating articles contiguously positioned on a conveyor system so that a lead article can be removed therefrom.

BACKGROUND OF THE INVENTION

In the assembly of circuit packs, a plurality of components are automatically inserted into apertures formed through a printed wiring board (PWB). Oftentimes, there is a need to automatically mount a hybrid integrated circuit (HIC) on the PWB. A typical HIC includes a printed circuit formed on one or both major surfaces of a substrate which may be made of ceramic material, and a plurality of elongated fragile leads mounted along opposite lateral edges of the substrate which communicate with the printed circuit. A plurality of chip carriers are then mounted on one or both of the major surfaces of the substrate. The size of the HIC and its fragile leads require special handling in mounting it on the PWB which usually results in manual manipulation by an operator. In an automatic assembly line, the manual mounting of HICs onto the PWB reduces the efficiency of the automatic assembly line and increases the cost of operating such an assembly line.

Consequently, there is a need for a technique which would automatically move a plurality of HICs to a work station and which would enable a leading HIC to be separated from the other HICs so that it may be subsequently removed from the work station and mounted on a PWB.

SUMMARY OF THE INVENTION

The foregoing need is met in one illustrative embodiment of the present invention wherein a method of presenting an article to a work station comprises the steps of loading a plurality of articles on a conveyor system, moving the conveyor system to move the articles past a first and then a second sensor, detecting the presence of a first one of the articles by means of the first and second sensors, detecting the presence of a second one of the articles by means of the first sensor, raising the second article in response to the detecting steps to separate the second article upward and away from the first article, and elevating the first article to a work station located above the plane of the raised second article.

In accordance with another embodiment of the present invention, an apparatus for presenting articles to a work station comprises means for conveying a row of articles positioned contiguous to each other thereon from a first location to a second location, a first article sensing means located between the first and the second locations, a second article sensing means located at the second location, means located between the locations and responsive to the first and the second sensing means for separating a second article of the row of articles from the first article of the row, and means located at the second location and responsive to the second sensing means for elevating the first article to a work station.

BRIEF DESCRIPTION OF THE DRAWINGS

FIG. 5 is a partial view of the apparatus of FIG. 3 taken along the lines 5—5;

FIG. 7 is a cross-sectional view of a portion of the apparatus of FIG. 3 to illustrate a conveyor system; and FIG. 8 is a cross-sectional view of a portion of the apparatus of FIG. 3 to illustrate a separating system.

DETAILED DESCRIPTION

Figure 1:
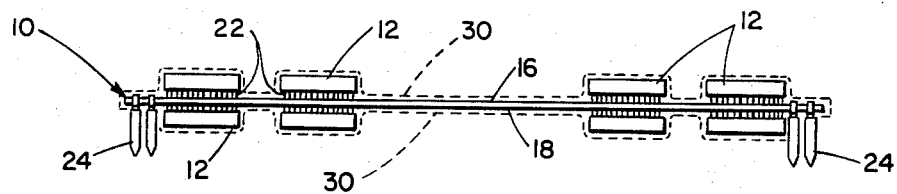
FIG. 1 is a side view showing a hybrid integrated circuit having a plurality of chip carriers mounted thereon.
Figure 2:
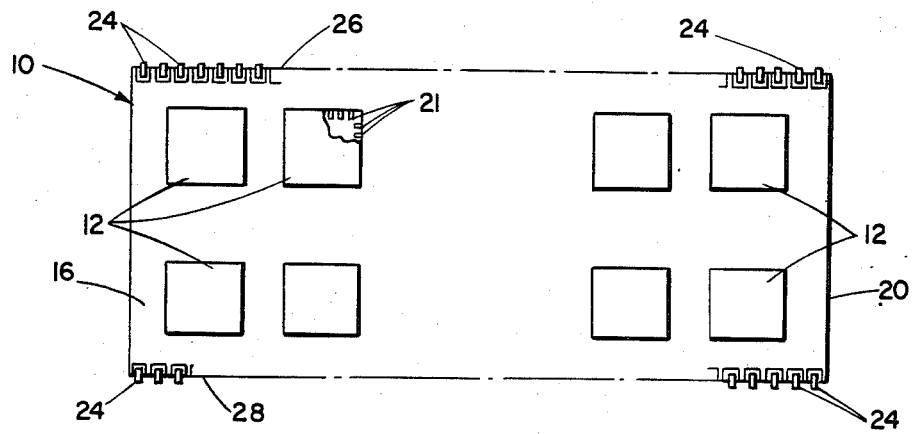
FIG. 2 is a top view showing a layout of the chip carriers mounted on one major surface of the hybrid integrated circuit of FIG. 1.

Referring to FIGS. 1 and 2, there is shown a hybrid integrated circuit (HIC), designated generally by the numeral 10, which includes a plurality of closely-spaced elements such as components or chip carriers 12 mounted thereon. The HIC 10 also includes a printed circuit (not shown) formed on major surfaces 16 and 18 of a substrate 20 made of ceramic or other insulating material. Moreover, a plurality of connection pads 21 are formed on the major surfaces 16 and 18 of the substrate 20 to enable the mounting of the chip carriers 12 thereon by means of a plurality of solder joints 22. A plurality of elongated leads 24 are mounted along edges 26 and 28 of the substrate 20 to enable the mounting of the HIC 10 onto a printed wiring board (not shown). The leads 24 are shown in FIG. 1 as being perpendicular to surfaces 16 and 18. The HIC 10 is encapsulated with a coating 30, made of silicone rubber or other well known encapsulating material, in order to protect the HIC and the connections thereon from environmental damage.

Figure 3:
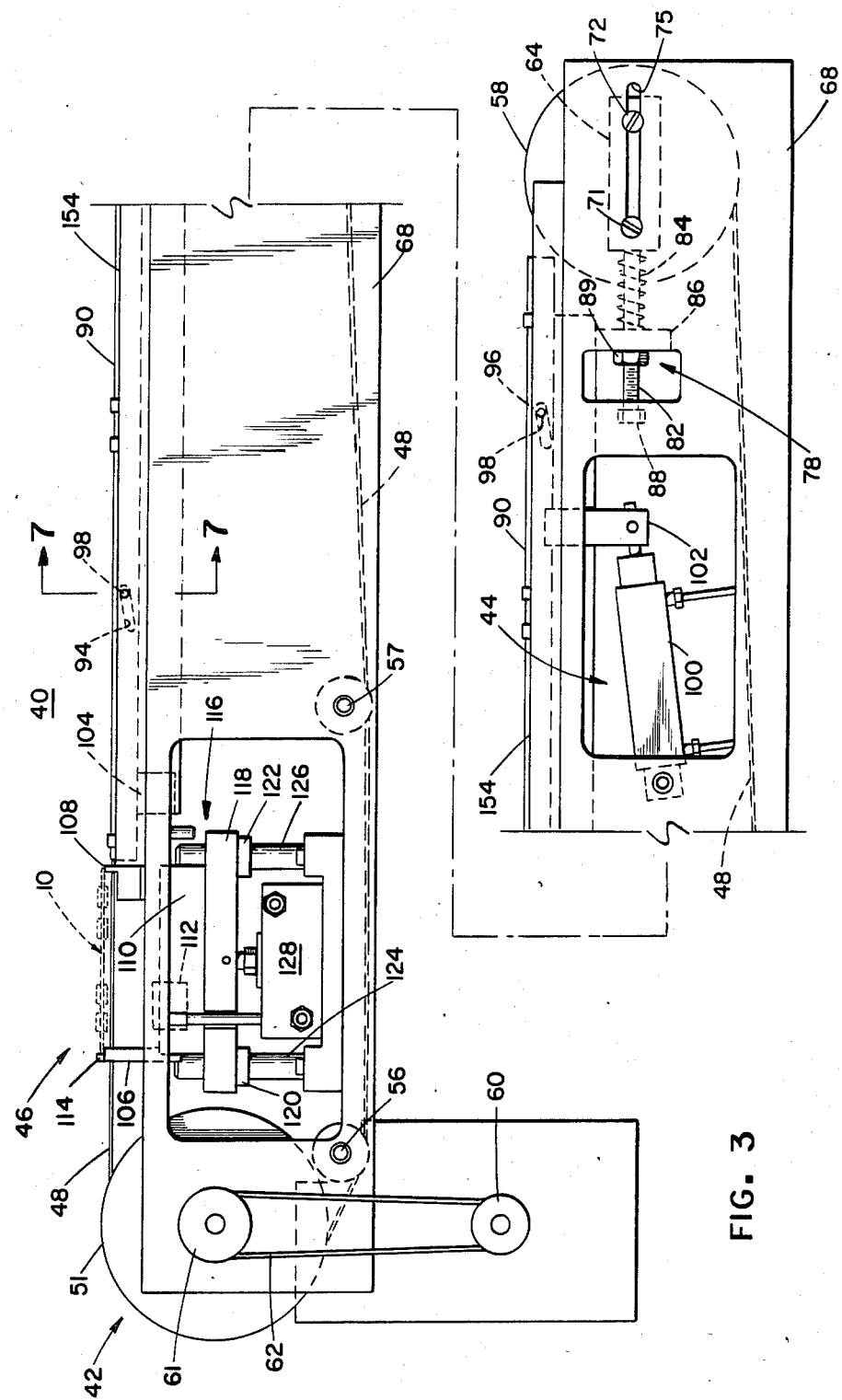
FIG. 3 is a side view of an apparatus for moving an article to a work station in accordance with an embodiment of the present invention.
Figure 4:
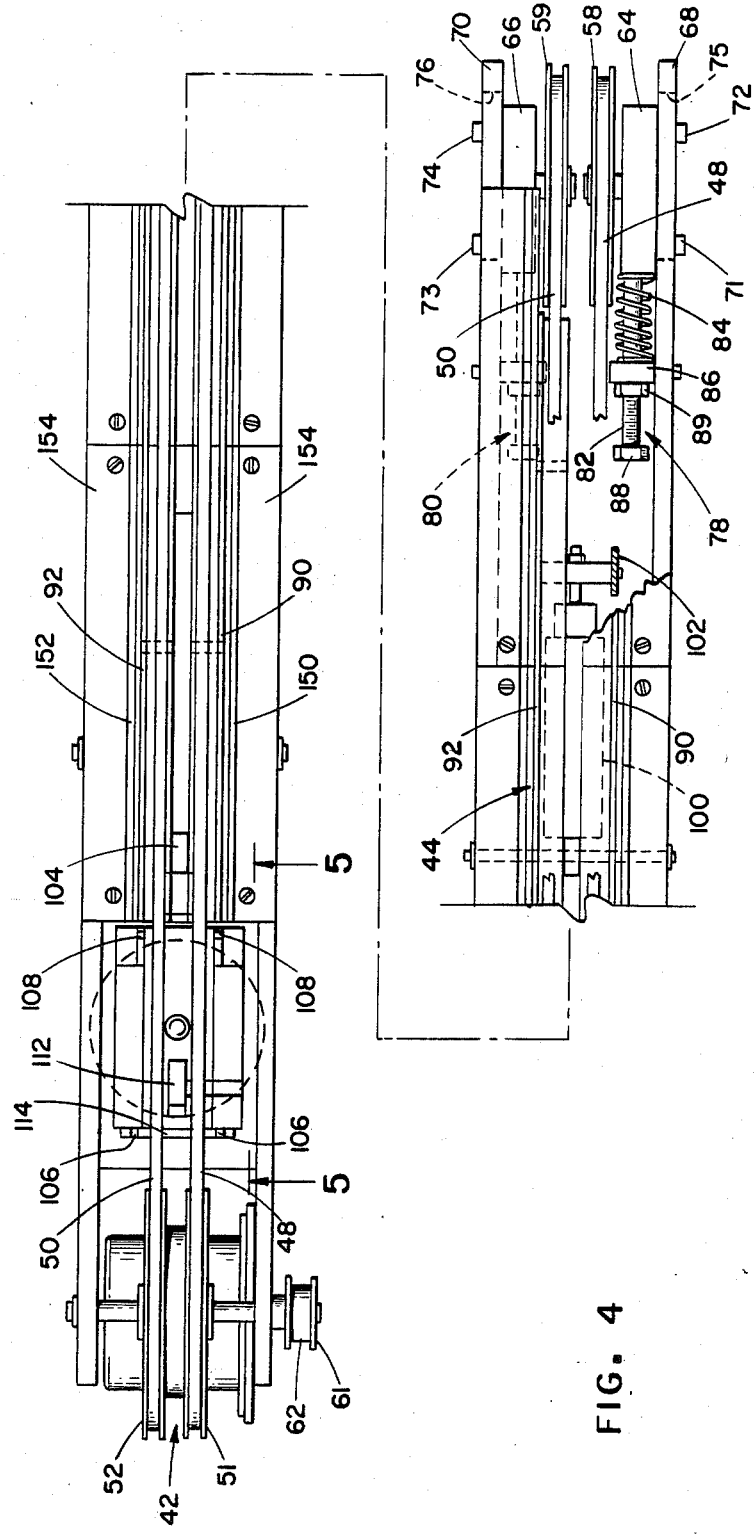
FIG. 4 is a top view of the apparatus of FIG. 3.

Referring to FIGS. 3 and 4, there is shown an apparatus, designated generally by the numeral 40, for moving an article, such as for example the HIC 10 shown in FIGS. 1 and 2, to a work station. The apparatus 40 includes a conveyor system 42, a separating system 44, and an elevating system 46.

The conveyor system 42 includes a pair of metal bands 48 and 50 which are trained around a pair of reels 51 and 52, two pairs of bearing rollers 56 and 57 and a pair of tension reels 58 and 59. A motor 60, coupled to a pulley 61 by means of a belt 62, drives the metal bands 48 and 50 in a continuous circular path. The tension reels 58 and 59 are mounted on brackets 64 and 66, respectively. The brackets 64 and 66 are secured to side walls 68 and 70 by shoulder screws 71, 72 and 73, 74 through slots 75 and 76, respectively. The conveyor system 42 also includes mechanisms 78 and 80 for adjusting the tension of the metal bands 48 and 50, respectively. Each of the mechanisms 78 and 80 includes a threaded shaft (such as shaft 82 of mechanism 78), fixedly attached to the respective brackets 64 and 66. A compression spring 84, positioned about the shaft 82 between the bracket 64 and a support bracket 86, biases the tension reel 58 outwardly from reel 51 as viewed in FIG. 3. Similarly, the tension adjusting mechanism 80 includes a compression spring (not shown) for biasing the tension reel 59 relative to reel 52. Brackets 86 include an aperture formed therein which supports a free end 88 of the threaded shaft 82. The rotation of a hex nut 89, threaded onto the respective threaded shaft 82 and abutting against the respective support bracket 86, facilitates a reduction in the tension of the respective metal bands 48 and 50 by increasing the compression of the spring 84.

The separating system 44 includes a pair of spaced parallel rails 90 and 92 mounted on the apparatus 40. The parallel rails 90 and 92 are positioned on apparatus 40 so that the metal bands 48 and 50 are interposed therebetween. A plurality of angularly formed slots 94 and 96 are formed in each of the rails 90 and 92 and mounted on apparatus 40 so that a set screw 98 is positioned within each of the slots 94 and 96. The rails 90 and 92 are coupled to a lifting mechanism including an air cylinder 100 and coupling brackets 102 (one shown). The slots 94 and 96 are oriented such that the rails 90 and 92 move upward and to the right as viewed in FIG. 3 when the air cylinder 100 is activated to extend. The separating system 44 also includes a sensor 104, such as a photo sensor, which generates and feeds a signal to a controller 105 (see FIG. 6) when an article, such as the HIC 10 shown in FIGS. 1 and 2, is positioned above it by the conveyor system 42.

The elevating system 46 includes a plurality of posts 106 and 108 adapted to contact the lower surface of the HIC 10 when the HIC is moved thereabove by the conveyor system 42 and when the elevating system 46 is activated. As shown in FIG. 5, the posts 106 and 108 are mounted on a support block 110. Also mounted in the support block 110 is a sensor 112 which generates and feeds a signal to the controller 105 (shown in FIG. 6) when a HIC 10 is positioned and detected thereabove. As best seen in FIG. 4, a post 114 is positioned between posts 106 and serves as a positive stop for a leading HIC 10 being transferred on the metal bands 48 and 50 of the conveyor system 42. The support block 110 is fixedly attached to a stage assembly 116 which includes an upper plate 118 having a pair of bushings 120 and 122 secured thereto and positioned about guide posts 124 and 126, respectively. An air cylinder 128, which is positioned below and secured to upper plate 118, enables the raising and lowering of the stage assembly 116 and the posts 106, 108 and 114 supported thereby.

Figure 6:
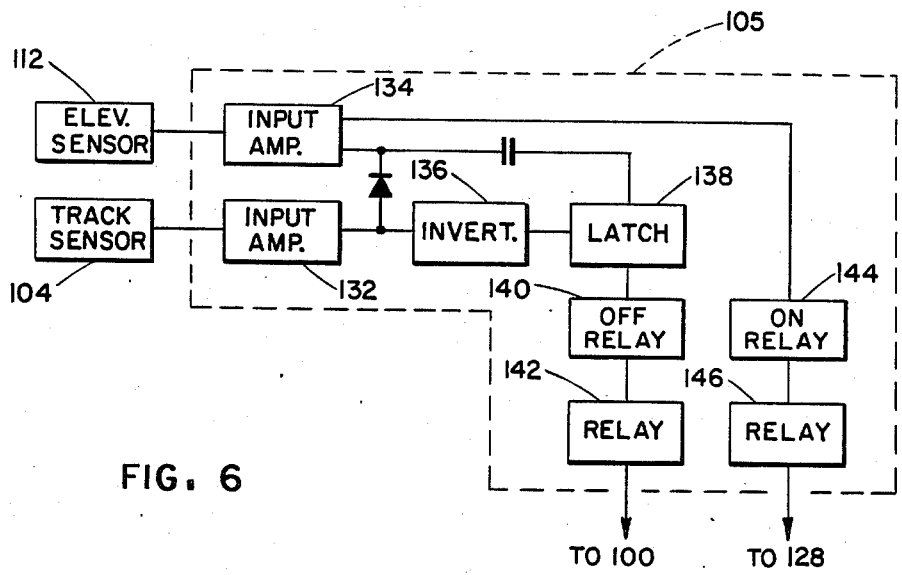
FIG. 6 is a schematic diagram of a controller for the apparatus of FIG. 3.

Referring to FIG. 6, there is shown a schematic diagram of the controller 105. Hereinafter, sensor 104 will be referred to as a track sensor and sensor 112 will be referred to as an elevator sensor. The track and the elevator sensors 104 and 112, respectively, generate and feed signals to input amplifiers 132 and 134, respectively, of the controller 105 whenever a HIC 10 is positioned above the respective sensor by the conveyor system 42. The input amplifier 132 generates and feeds an output signal, through an inverter circuit 136, to an input terminal of a latch module 138 in response to the signal generated by the track sensor 104. The other input amplifier 134 also generates and feeds an output signal to another input terminal of the latch module 138 in response to the signal generated by the elevator sensor 112. The latch module 138, in response to the signals from the amplifiers 132 and 134, generates and feeds an output signal to an OFF-delay module 140 which operates a relay 142 to activate the air cylinder 100 shown in FIGS. 3 and 4. Moreover, the amplifier 134 feeds an output signal to an ON-delay module 144. The ON-delay module 144 delays the generation of its output signal for a predetermined amount of time and then operates a relay 146 to activate the air cylinder 128 (FIG. 3).

In operation and referring to FIGS. 3, 4, 5, 7 and 8 of the drawings, a plurality of HICs 10 are loaded on the conveyor system 42 of the apparatus 40 in tandem contiguous positions near reels 58 and 59. As is best seen in FIG. 7, the plurality of leads 24 mounted along edges 26 and 28 of the HIC 10 are positioned within slots 150 and 152, respectively, formed in upper plate 154 of the apparatus 40. As the conveyor system 42 moves the HICs 10 in a direction toward reels 51 and 52, a leading HIC is detected by the track sensor 104 as it passes thereabove. The controller 105 does not react to a signal from the track sensor 104 only. Thereafter, the leading HIC 10 is moved above the elevator sensor 112 which feeds a signal to amplifier 134 of the controller 105. As noted above and referring to FIG. 6, the ON-delay module 144 delays the feeding of the signal to the relay 146 which allows the leading HIC 10 to contact the post 114 which serves as a positive stop for HICs being transferred by the conveyor system 42. As a result of the contiguous positions of the HICs 10 on the conveyor system 42, a HIC is now positioned above the track sensor 104. The relay 142 of the controller 105 is now operated to activate the air cylinder 100 which raises the rails 90 and 92 to elevate all trailing HICs from the metal bands 48 and 50 to a higher plane as is best seen in FIG. 8. Moreover, the trailing HICs are separated away from the leading HIC by movement of the rails 90 and 92 toward the tension reels 58 and 59 as a result of the slots 94 and 96 sliding about the screws 98. Thereafter, the relay 146 of the controller 105 operates to activate the air cylinder 128 which raises the stage assembly 116. As the stage assembly 116 is raised, the posts 106 and 108 contact the lower surface of the leading HIC positioned thereabove and elevate it to a work station located above the plane of the now-elevated trailing HICs. The elevated leading HIC is subsequently removed from the apparatus 40 by automatic or manual means. After the leading HIC is removed from the apparatus 40, a change in state of the output signal generated by the amplifier 134 causes the relay 146 to operate thereby lowering the stage assembly 116 by means of air cylinder 128. Moreover, the output signal of the latch module 138 changes state due to the removal of the leading HIC from the elevating system 46. However, the OFF-delay module 140 maintains its present state for a predetermined time which delays the lowering of the rails 90 and 92 by air cylinder 100 until the stage assembly 116 has been completely lowered. Thereafter, the rails 90 and 92 are lowered to return the trailing HICs to the bands 48 and 50 thereby permitting the next HIC to be moved above, and be detected by, the elevator sensor 112.

In the event that the plurality of HICs are loaded on the apparatus 40 such that the spacing between HICs equals or exceeds the length of a single HIC, the sequence of operation of the apparatus differs from that stated above. In that case, the leading HIC is detected first by the track sensor 104 with no action taken by the controller 105 and then by the elevator sensor 112. Since the spacing between HICs equals or exceeds the length of a single HIC, another or second HIC will not be positioned above the track sensor 104. Thus, the controller 105, after a delay, will activate the air cylinder 128 to raise the stage assembly 116 and the HIC positioned thereabove to the work station. If there are no other HICs being conveyed by the metal bands 48 and 50, the controller will lower the stage assembly 116 after the HIC positioned thereabove is removed. However, if other HICs are being conveyed by the metal bands 48 and 50 and are detected by the track sensor 104 after the stage assembly is being or has been raised, the controller 105 immediately activates the air cylinder 100 to raise rails 90 and 92 which in turn separate all of the HICs being conveyed from the leading HIC. Subsequently, the leading HIC positioned above the stage assembly 116 is removed, and the stage assembly 116 and the rails 90 and 92 are lowered in the same sequence as noted above for HICs having contiguous positions.

The present invention has been described with reference to particular embodiments. It is to be understood, however, that the described embodiments are merely illustrative of the principles and applications of the invention. Numerous modifications and variations may be made by those skilled in the art without departing from the spirit and scope of the invention.

What is claimed is:

1. A method of moving articles to a work station comprising the steps of:
    positioning the articles contiguous to each other on a conveyor system in a first plane;
    driving the conveyor system so that a first one of the articles is moved past, and detected by, a first and then a second sensor;
    generating a first signal in response to the detection of the first article by the second sensor and generating a second signal in response to the detection of a second article, adjacent to said first article, by the first sensor;
    raising a pair of rails positioned beneath the second and subsequent articles in response to the first and second signals to raise the second and subsequent articles upward and away from the first article and out of engagement with the conveyor system to a second plane above the first plane of the conveyor system;
    elevating the first article in response to the first signal to a work station located above the second plane of the raised second article; and
    after the first article is elevated, lowering the pair of rails to lower the second and subsequent articles into engagement with the conveyor system,
    where the pair of rails is raised to separate the second and subsequent articles from the first article before the first article is elevated.

2. A method in accordance with claim 1 wherein the raising step comprises the steps of:
    operating a selectively energizeable switch in response to the first and second signals; and
    activating a lifting mechanism coupled to the pair of rails in response to the operation of the switch thereby moving the pair of rails in a predetermined path.

3. A method in accordance with claim 1 wherein the elevating step comprises the steps of:
    generating a delay signal in response to the first signal;
    operating a selectively energizeable switch in response to the delay signal; and
    activating an elevating means in response to the operation of the switch for elevating the first article to the work station.

4. An apparatus for presenting articles to a work station comprising:
    means for conveying a row of articles positioned contiguous to each other thereon from a first location to a second location;
    a first sensing means located between said first and said second locations;
    a second sensing means located at said second location;
    the second sensing means for detecting a first article of the row of articles and generating a first signal in response to the detection of the first article;
    the first sensing means for detecting a second article of the row of articles, the second article being adjacent to the first article, and generating a second signal in response to the detection of the second article;
    means located between said locations and responsive to the first and the second signals for separating the second and subsequent articles of the row of articles upward and away from the first article of the row and out of engagement with the conveying means; and
    means located at said second location and responsive to the first signal for elevating the first article to a work station,
    where the separating means is responsive to the elevation of the first article for lowering the second and subsequent articles into engagement with the conveying means.

5. An apparatus in accordance with claim 4 wherein the separating means comprises:
    a pair of elongated rails spaced such that the conveying means is positioned therebetween;
    means coupled to the pair of rails for selectively moving the rails along a predetermined path; and
    means responsive to the first and the second signals for activating the moving means to separate the second and subsequent articles upward and away from the first article.

6. An apparatus in accordance with claim 4 wherein the elevating means comprises:
    a stage assembly;
    an article support means mounted on the stage assembly;
    means, coupled to the stage assembly, for raising and lowering the stage assembly; and
    means, responsive to the first signal, for activating the raising and lowering means to move the first article to the work station located above the plane of the second article when raised.

7. An apparatus in accordance with claim 4 wherein the conveying means comprises:
    a pair of metal bands driven in a circular path by a driving means; and
    means for selectively tensioning the pair of metal bands.

8. An apparatus for presenting articles to a work station comprising:
    means for conveying a row of articles positioned contiguous to each other thereon from a first location to a second location, the conveying means comprising a pair of metal bands driven in a circular path by a driving means and means for selectively tensioning the pair of metal bands;
    a first sensing means located between said first and said second locations;
    a second sensing means located at said second location;

the second sensing means for detecting a first article of the row of articles and generating a first signal in response to the detection of the first article;

the first sensing means for detecting a second article of the row of articles, the second article being adjacent to the first article, and generating a second signal in response to the detection of the second article;

means located between said locations and responsive to the first and the second signals for separating the second and subsequent articles of the row of articles upward and away from the first article of the row, the separating means comprising a pair of elongated rails spaced such that the conveying means is positioned therebetween, means coupled to the pair of rails for selectively moving the rails along a predetermined part, and means responsive to the first and the second signals for activating the moving means to separate the second and subsequent articles upward and away from the first article; and means located at said second location and responsive to the first signal for elevating the first article to a work station, the elevating means comprising a stage assembly, an article support means mounted on the stage assembly, means, coupled to the stage assembly, for raising and lowering the stage assembly, and means, responsive to the second sensing means, for activating the raising and lowering means to move the first article to the work station located above the plane of the second article when raised, wherein the raising and lowering means lowers the stage assembly in response to a removal of the first article; and wherein the moving means returns the rails along the predetermined path a predetermined time after the removal of the first article such that the rails are returned after the stage assembly is lowered.

9. A method of moving articles to a work station comprising the steps of:

positioning the articles on a conveyor system;

driving the conveyor system so that a first one of the articles is moved past, and detected by, a first and then a second sensor;

generating a first signal in response to the detection of the first article by the second sensor;

generating a second signal in response to the detection of a second article by the first sensor;

raising a pair of rails positioned beneath the second and subsequent articles in response to the first and second signals to raise the second and subsequent articles upward and away from the first article and out of engagement with the conveyor system;

generating a delay signal in response to the first signal;

elevating the first article to a work station in response to the delay signal; and after the first article is elevated, lowering the pair of rails to lower the second and subsequent articles into engagement with the conveyor system, wherein the raising step is performed before the elevating step when the first and second articles are positioned contiguous to each other on the conveyor system; and wherein the raising step is performed during and after the elevating step when the first and second articles are positioned at least a fixed distance apart on the conveyor system.

* * * * *